United States Patent
Laub (10) Patent No.: US 6,380,740 B1
(45) Date of Patent: Apr. 30, 2002

(54) METHOD FOR ACQUIRING TIME-RESOLVED AND LOCATION-RESOLVED, THREE-DIMENSIONAL DATA SETS WITH MAGNETIC RESONANCE AND APPARATUS FOR THE IMPLEMENTATION OF THE METHOD

(75) Inventor: Gerhard Laub, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 63 days.

(21) Appl. No.: 09/580,960

(22) Filed: May 30, 2000

(30) Foreign Application Priority Data

May 28, 1999 (DE) .......................................... 199 24 448

(51) Int. Cl.⁷ ................................................. G01V 3/00
(52) U.S. Cl. ....................................... 324/309; 324/307
(58) Field of Search ................................ 324/309, 307, 324/306, 312, 314, 318, 322, 300

(56) References Cited

U.S. PATENT DOCUMENTS

| | | | |
|---|---|---|---|
| 5,417,213 A | 5/1995 | Prince | 128/654 |
| 5,474,067 A | 12/1995 | Laub | 324/306 |
| 5,553,619 A | 9/1996 | Prince | 128/654 |
| 5,579,767 A | 12/1996 | Prince | 128/654 |
| 5,590,654 A | 1/1997 | Prince | 324/309 |
| 6,198,959 B1 * | 3/2001 | Wang | 324/307 |
| 6,201,985 B1 * | 3/2001 | Polzin et al. | 324/309 |
| 6,268,730 B1 * | 7/2001 | Du | 324/309 |
| 6,275,037 B1 * | 8/2001 | Harvey et al. | 324/307 |

FOREIGN PATENT DOCUMENTS

| | | |
|---|---|---|
| DE | OS 43 17 028 | 11/1994 |
| DE | OS 197 13 005 | 10/1998 |
| EP | 0 543 468 | 5/1993 |

OTHER PUBLICATIONS

"Ultrafast Imaging Using Gradient Echoes," Chien et al., Magnetic Resonance Quarterly, vol. 7, No. 1, (1991), pp. 31–36.

"A Circular Echo–Planar Pulse Sequence," Pauly et al., Proc. Soc. Mag. Res., vol. 2 (1995) p. 106

"Are the Corners of k–space Worth Preserving?" Bernstein, Proc. Soc. Mag. Res., vol. 2 (1995) p. 734.

* cited by examiner

Primary Examiner—Louis Arana
(74) Attorney, Agent, or Firm—Schiff Hardin & Waite (57) ABSTRACT

In a method for acquiring time-resolved and location-resolved, three-dimensional datasets by magnetic resonance and an apparatus for the implementation of the method the three-dimensional k-space is divided into annular segments in a phase coding direction. The phase coding steps are defined in their chronological sequence such that the central segment of k-space is acquired more often than outer segments. The spatial/temporal resolution thus can be improved, particularly in MR angiography.

8 Claims, 6 Drawing Sheets

ALLOCATION OF MEASURED VALUES TO k-space SEGMENTS

B0-A0-C1-A1-B1-A2-C2-A3-B2-A4-C3-A5-B3-A6-C4-A7-B4-A8-C5-A9-B5A10-....

| A1 | A2 | A3 | A4 | A5 |
|---|---|---|---|---|
| {3/4C1, 1/4C2} | {1/4C1, 3/4C2} | {3/4C2, 1/4C3} | {1/4C3, 3/4C3} | {3/4C3, 1/4C4} |
| {1/4B0, 3/4B1} | {3/4B1, 1/4B2} | {1/4B1, 3/4B2} | {3/4B2, 1/4B3} | {1/4B2, 3/4B3} |
| {1/4B0, 3/4B1} | {3/4B1, 1/4B2} | {1/4B1, 3/4B2} | {3/4B2, 1/4B3} | {1/4B2, 3/4B3} |
| {3/4C1, 1/4C2} | {1/4C1, 3/4C2} | {3/4C2, 1/4C3} | {1/4C3, 3/4C3} | {3/4C3, 1/4C4} |

METHOD FOR ACQUIRING TIME-RESOLVED AND LOCATION-RESOLVED, THREE-DIMENSIONAL DATA SETS WITH MAGNETIC RESONANCE AND APPARATUS FOR THE IMPLEMENTATION OF THE METHOD

BACKGROUND OF THE INVENTION

1. Field of the Invention

The present invention is directed to a method for acquiring time-resolved and location-resolved three-dimensional data sets by magnetic resonance, as well as to an apparatus for implementing the method.

2. Description of the Prior Art

The representation of blood vessels (angiography) is currently being increasingly implemented with MR technology. An MR contrast agent (for example, GdDTPA) is often utilized for this purpose in conjunction with a shortening of the T1 time, so that the spread of the contrast agent can be tracked well with the assistance of highly T1-weighted pulse sequences. Typically, the contrast agent is intravenously injected. The examination is implemented as soon as the contrast agent is located in specific arteries. Given the standard contrast agent dose and an injection rate of 2 ml/s, the injection is carried out over a time span of, for example, 8–12 seconds. The MR measurement must ensue when the contrast agent is flowing through the vessel section to be examined. When, for example, the contrast agent has already spread in veins or in tissue sections that lie in the observation window, a diagnosis on the basis of the angiography examination becomes considerably more difficult. An exact timing of the MR measurement is not entirely simple, particularly because the time between the beginning of the contrast agent injection and the appearance of the contrast agent in the vessel section to be examined (also referred to as transit time) varies dependent on the vascular section to be examined and also differs from patient to patient. Therefore, a fixed time difference between contrast agent injection and measurement can therefore be employed; rather, the point in time of the measurement must be individually matched to the examination. These relationships are explained, for example, in U.S. Pat. Nos. 5,417,213 and 5,553,619 and 5,579,767 and 5,590,654.

Heretofore, one of the following methods was usually employed for synchronization between contrast agent injection and measurement:

A prior information about the average transit time: The transit time to a specific vascular section can be roughly empirically estimated. Additionally, age or other physiological information about the patient can also be considered in order to correctly estimate the transit time. Dependent on the experience of the examining person and on the individual measuring situation, unusable measurements or even misinterpretations, however, can occur.

Measuring the transit time with the assistance of a test bolus: A small test bolus (for example, approximately 1 cm³) of the contrast agent is employed in order to determine the actual transit time. This in fact leads to more precise measurements but lengthens the measuring time and increases the outlay for the operator of the system.

It is also known to use a fast, two-dimensional MR sequence to observe when the contrast agent arrives in an area in the observation window or just before the observation window. As soon as the examining person determines the arrival of the contrast agent, the start signal is given for the actual angiography measurement in the form of a 3D measuring sequence.

The aforementioned measuring sequence can also be automated in that the MR system recognizes a signal change due to the entry of the contrast agent in a test measuring window and then automatically triggers the angiography measurement with a 3D measuring mode.

In addition to exact timing, another problem in the above technique is that only one image is obtained in a predetermined measuring window. If a vessel, particularly in the case of a vascular illness, does not fill with contrast agent until later, this can lead to a misdiagnosis.

It is also possible to implement a series of 3D measurements following one another fast enough, with especially fast gradient echo sequences, so that not only the condition of the spread of the contrast agent at a predetermined point in time that is identified, but also the flow behavior of the contrast agent bolus into an observation window or, in more general terms, the contrast agent dynamics in the vessels under observation that can be acquired. The diagnostic value is thus considerably expanded, and the aforementioned problems with the exact timing of the measurement are eliminated. For example, a repetition time of 3.2 ms is currently achieved with fast gradient echo sequences having extremely short echo times. The measuring time Tacq for the measurement of a complete 3D dataset is derived according to the following equation:

$$Tacq = TR \cdot Np \cdot Ns$$

wherein Tacq is the measuring time, TR is the repetition time, Np is the number of phase-coding steps in a phase coding direction, and Ns is the number of phase-coding steps in slice selection direction. When, for example, Np=100 and Ns=24 are selected, then the measuring time for a 3D dataset is 7.75, with the aforementioned repetition time of TR=3.2 ms. An adequate separation of arterial and venous phases is generally achieved by means of a series of such measurements, for example in the carotid artery. The spatial resolution is established by the number of phase coding steps in phase coding direction or slice selection direction. It follows from the above equation that the measuring time becomes longer, i.e. the time resolution becomes poorer, the better the spatial resolution is. Such measurements are therefore always a compromise between time resolution and spatial resolution.

German PS 43 27 325, corresponding to U.S. Pat. No. 5,474,067, discloses a technique for shortening the measuring time for motion events without having to accept losses in the time resolution. The k-space can thereby be divided into individual segments. With the acquisition of a number of filed raw datasets at different times of a motion sequence, signals of the middle segment are employed in common for two chronologically successive raw datasets, i.e. the middle segment is measured more often than the other segments. The fact is exploited that the image contrast of the image reconstructed from the raw datasets is predominantly determined by the center of the k-space.

Although the time resolution and/or spatial resolution of MR measurement is already clearly improved with this method, the spatial or time resolution is still inadequate in many applications, particularly given 3D datasets.

It is known, for example from the article, "Are the corners of k-space worth preserving?", by M. A. Bernstein, Proceedings of the Society of Magnetic Resonance, 1995, Vol. 2, page 734, that the "corners" of the k-space, i.e. data that lie outside a circle, can be discarded in the image reconstruction without greater sacrifices in quality.

According to an article, "A circular echo planar pulse sequence", by J. M. Pauly et al., Proceedings of the Society of Magnetic Resonance, 1995, page 106, this fact is used for scanning a circular area of the k-space with an EPI sequence. The lines of the raw data matrix are thereby shortened toward the edges of the k-space in readout direction.

German OS 43 17 028, corresponding to U.S. Pat. No. 5,754,046, discloses a modified keyhole scanning method of a three-dimensional k-space. The k-space is subdivided into cuboid sub-areas, each cuboid covering the entire k-space in the z-coordinate direction. Sub-areas of the overall dataset that change from measurement to measurement are updated in a predetermined sequence.

German OS 197 13 005 discloses implementing the phase coding of the nuclear magnetic resonance signals, for contrast agent tracking with MR imaging, such that measured values in the central area of the k-space are acquired at earlier times than measured values in edge regions of the k-space.

Segmenting does not take place in this method.

SUMMARY OF THE INVENTION

An object of the present invention is to implement a method or an apparatus for acquiring a number of three-dimensional MR datasets such that the spatial resolution and/or time resolution of the measurement is improved.

This object is achieved in a method and apparatus according to the invention, wherein nuclear spins are excited in an examination subject and nuclear spins are phase coded in first and second phase coding directions by respective phase coding gradients, and wherein the nuclear spins are read out from the subject under a readout gradient in a further direction, and wherein the phase coding and readout steps are repeated for respectively different combinations of phase coding in the phase coding directions, so that a number of three-dimensional data sets, occupying three-dimensional k space in respective segments, are obtained, these segments including a central, cylindrical segment and a number of annular cylindrical segments successively surrounding the central cylindrical segment, each of the segments having a longitudinal axis in the readout direction, and wherein the three-dimensional datasets are respectively allocated to a number of different time spans, with the different combinations of the phase coding gradients having a chronological sequence so that data occupying the central k space segment are acquired more often than data occupying the annular segments.

In accordance with the inventive method and apparatus, therefore, a reduction of the amounts of data measured per 3D dataset occurs in two respects, so that a higher time/spatial resolution than in conventional methods and devices is obtained. First, the lines in the z-direction within in the "corners" of the 3D k-space are not measured, which has practically no negative effect on the image quality for reasons that are known. Second, due to the segmenting, only a cylindrical region of the k-space is measured anew for each 3D dataset, whereas the other, annular segments are employed in common for successive 3D datasets. Compared to the segmenting into cuboid areas of the 3D k-space disclosed by the aforementioned German OS 43 27 325, the annular segmentation in accordance with the invention is adapted better and thus leads to an improved spatial/time resolution.

In an embodiment, an interpolation of the measured values preceding and following the measuring time window of the central segment in terms of time is implemented in segments outside the central segment. The spatial/time resolution thus can be improved further.

A further reduction in the amounts of measured data without significant losses in spatial resolution is obtained in an embodiment wherein substantially only half, or even only one-fourth, of the 3D k-space that is measured. The fact is exploited that the raw data matrices are conjugate-symmetrical relative to the axes, so that one quadrant or one half of the overall raw dataset contains the complete information. Employment of the method in MR angiography is especially advantageous since it allows the spread of the contrast agent in the blood stream to be observed very well.

DESCRIPTION OF THE PREFERRED EMBODIMENTS

FIGS. 1 through 5 represent the prior art and only serve the purpose of explaining the problem.

Figure 1:
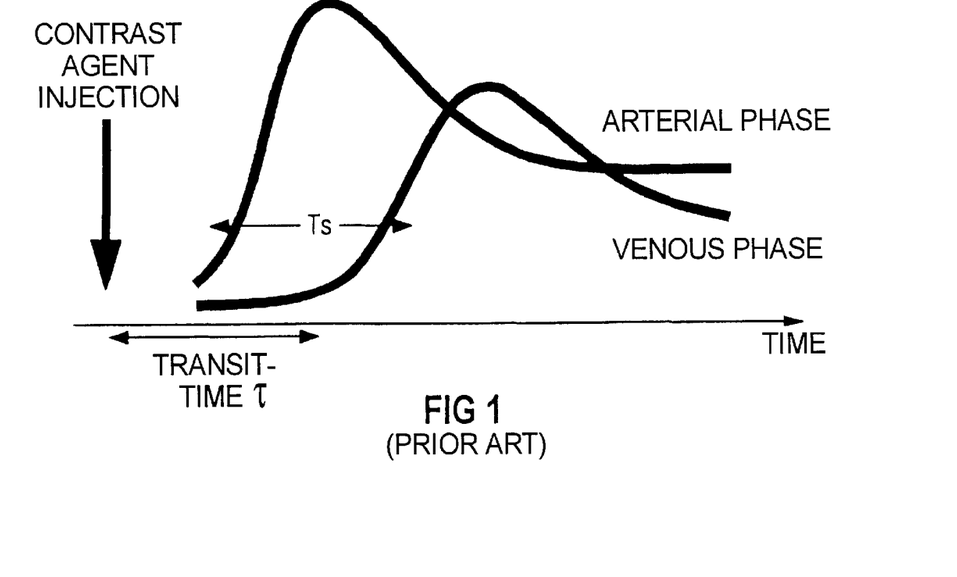
FIG. 1 shows the course of the spread of contrast agent after an injection, as is conventional.

FIG. 1 shows the relationship between contrast agent injection and the contrast agent enrichment in arteries (also referred to as arterial phase) and veins (also referred to as venous phase). The contrast agent injection starts at time 0 and achieves a maximum enrichment in the arteries in a time span that is usually referred to as "transit time" in the technical field. Subsequently, the enrichment in the arteries decays in turn and instead increases in the veins. Due to its paramagnetic properties, the contrast agent boosts the nuclear magnetic resonance signal given the T1-weighted sequences that are applied here. In most instances, it is mainly the arterial spread that one wishes to see, whereby the signal from the veins is then merely disruptive. In many examinations, the measuring time window Ts therefore is placed such that the enrichment of contrast agent in the arteries under observation exhibits a maximum while it is still slight in the veins. In this case, however, the dynamic spread of the contrast agent cannot be acquired, and the problem explained above exists, namely that the measurement must sequence in a specific time window that cannot be exactly defined in advance. It is therefore significantly more elegant to continuously implement the measurement after the contrast agent injection, i.e. to measure a number of 3D datasets that show the spread of contrast agent at different points in time. For the reasons already cited, however, it is difficult to measure enough data in order to obtain an adequate time resolution as well as an adequate spatial resolution.

A known solution is to segment k-space and to measure the central segment of k-space more often than the edge segments.

Figure 2:
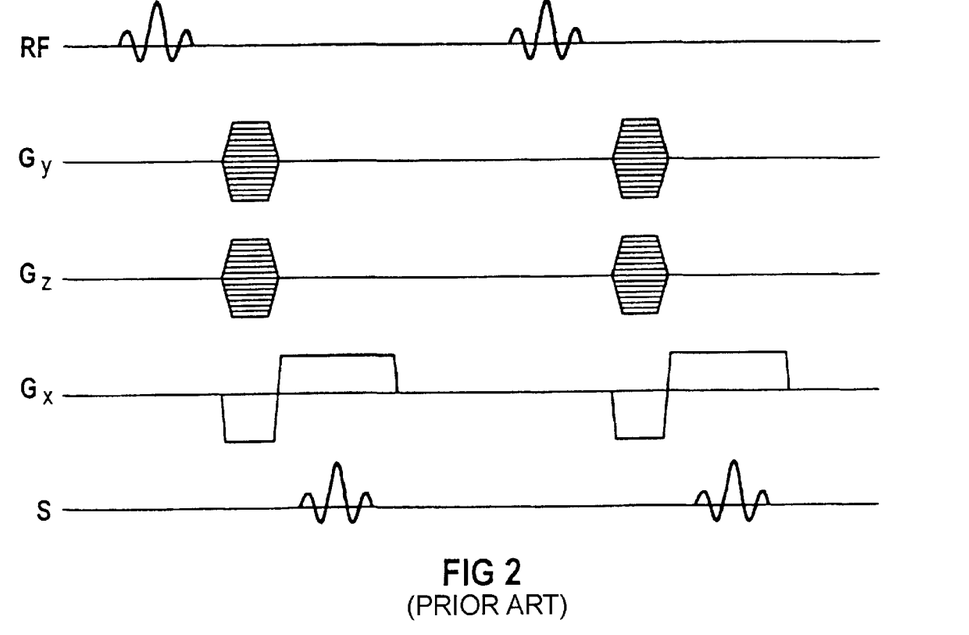
FIG. 2 is a schematic example of a known MRI pulse sequence.

For explaining this principle, FIG. 2 first schematically shows a conventional pulse sequence for the acquisition of three-dimensional (3D) raw datasets. An excitation with a radiofrequency pulse RF is followed by phase coding with phase coding gradients Gy and Gz, in the y-direction and z-direction of a Cartesian coordinate system in this example. Further, a prephasing ensues in the third direction, i.e. in the x-direction in the example. Subsequently, a nuclear magnetic resonance signal S is read out under a readout gradient in x-direction. This procedure is repeated with different combination of phase coding gradients Gy and Gz, the nuclear magnetic resonance signals thereby acquired are sampled in the time domain, digitalized, and the numerical values that are then obtained are entered into a row of a raw data matrix per nuclear magnetic resonance signal S. The raw data matrix can be considered to be a measured data space that is generally referred to as "k-space" in nuclear magnetic resonance tomography.

The information about the spatial origin of the signal contributions S needed for the imaging is encoded in the phase information, the relationship between the location space (i.e. the image) and the k-space existing mathematically via a two-dimensional Fourier transformation. The following is valid:

$$S(k_x, k_y, k_z) = \int \int \int \rho(x,y,z) e^{i(k_x X + k_y Y + k_z z)} dx dy dz$$

The following definitions apply:

$$k_z(t) = \gamma \int_0^t G_z(t') dt'$$

$$k_x(t) = \gamma \int_0^t G_x(t') dt'$$

$$k_y(t) = \gamma \int_0^t G_y(t') dt'$$

ρ is the nuclear spin density and γ is the gyromagnetic ratio.

Figure 3:
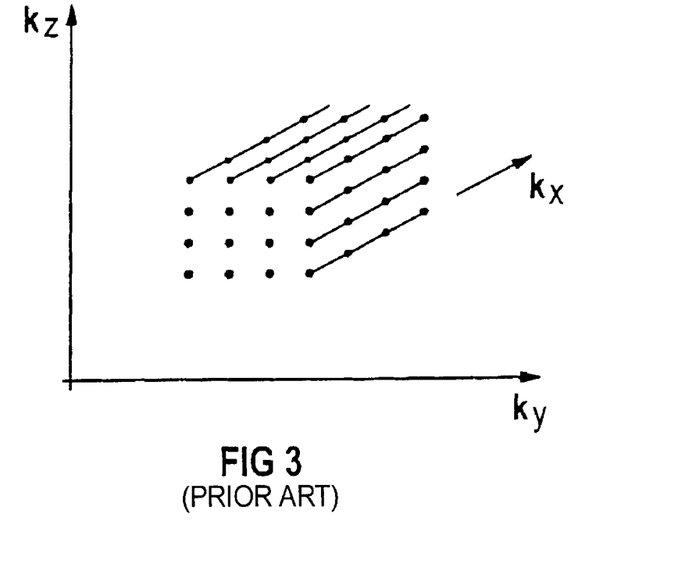
FIG. 3 is a schematic illustration of the known arrangement measuring points in k-space.
Figure 4:
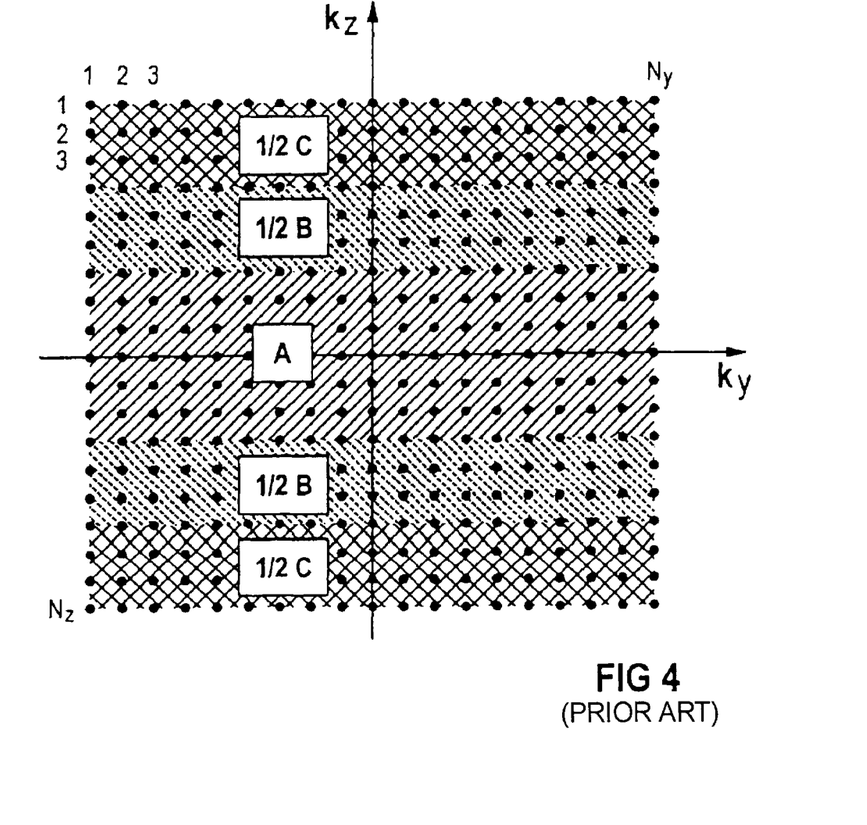
FIG. 4 shows the conventional division of k-space into segments.

As a result of a sufficiently frequent repetition of the measurement with different values of Gy and Gz, a three-dimensional dataset as shown, for example, in FIG. 3 is obtained in the above-defined k-space. Each signal corresponds to a row in the x-direction.

It is known to divide k-space as shown in FIG. 3 into three segments in the z-direction. These segments are shown in z-y section in FIG. 4. A central segment is referenced A. Respective halves of a segment B are disposed above and below segment A. Two halves of the segment C follow thereupon as edge segments. The segments A, B and C can, for example, each have the same volume.

On the basis of a corresponding getting of the phase coding gradients Gy, Gz, the allocation of the measured values acquired from the following nuclear magnetic resonance signal to respective segments is determined. As an example, a sequence for the allocation of the measured values to the individual segments is indicated in the first row in FIG. 5. The number of the respective measurement in the appertaining segment is thereby referenced with the numeral following the segment designation A, B, C. It can be seen that measured values in the central segment A are measured twice as often as measured values in the outer segments B and C. The fact is utilized that the image contrast is predominantly defined by the center of k-space, so the fact that the outer regions are measured less often has hardly any influence on the image appearance.

Figure 5:
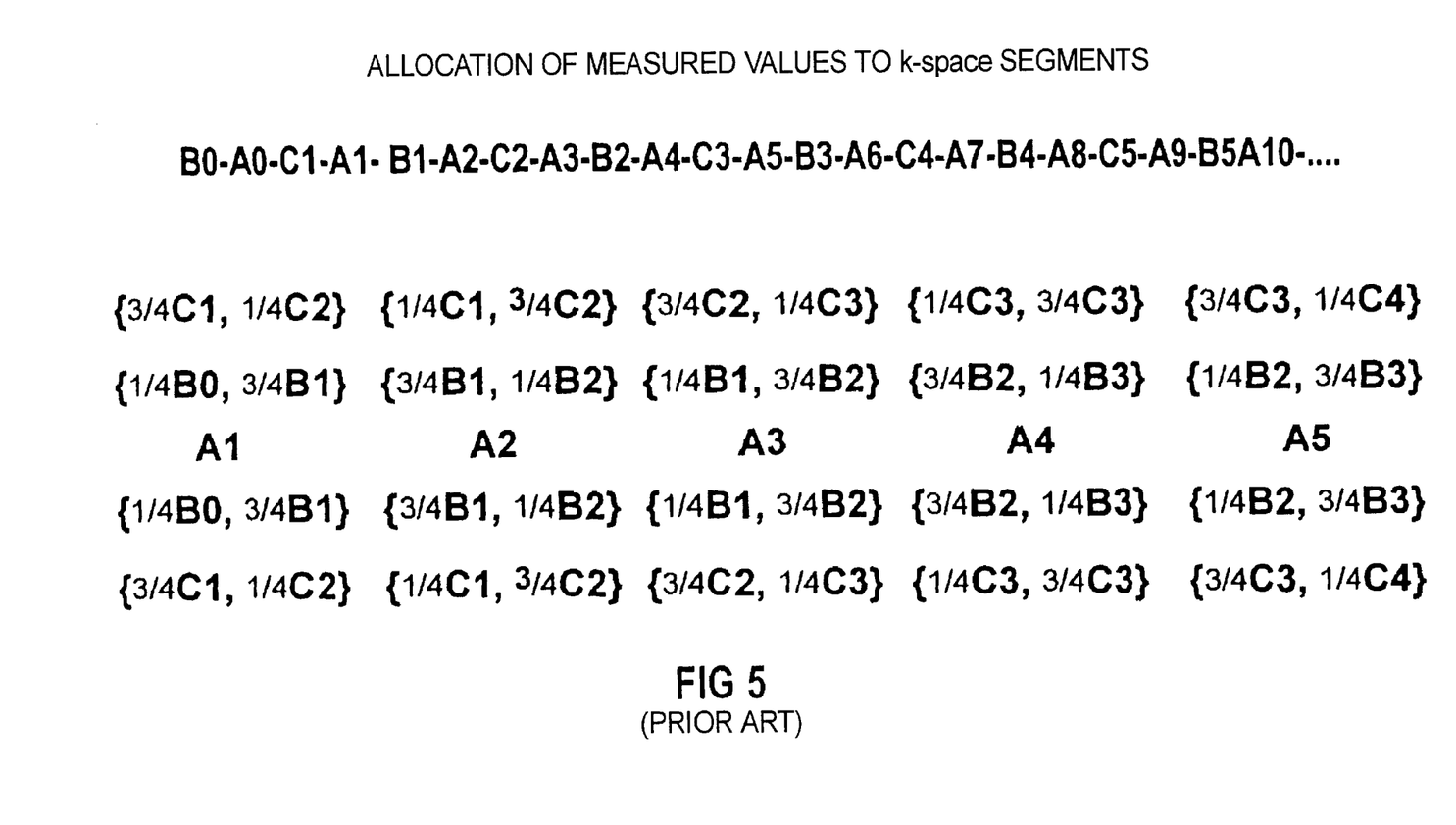
FIG. 5 schematically shows a known sequence of the measurements and the interpolation over the individual measured values.

The lower portion of FIG. 5 schematically shows how the measured values are allocated to five successive raw data matrices. The measurements A1 through A5 form the center of the raw data matrices. Since the measured values for the segments B and C are acquired chronologically before or after the corresponding measured values for the segment A, an interpolation of the measured values measured previously and afterward in the segments B and C is implemented here. Looking at, for example, one observes the point in time of the measurement A1 in the first row of FIG. 5, it can be been that the measurement B0 is the third measurement before the measurement A1 and the measurement B1 is the one immediately following the measurement A1. The measured values B0, B1 . . . are therefore weighted according to their chronological spacing from the measurement A1, i.e. B0 with ¼ and B1 with ¾. One proceeds accordingly with all other measured values for the segments B and C.

Figure 6:
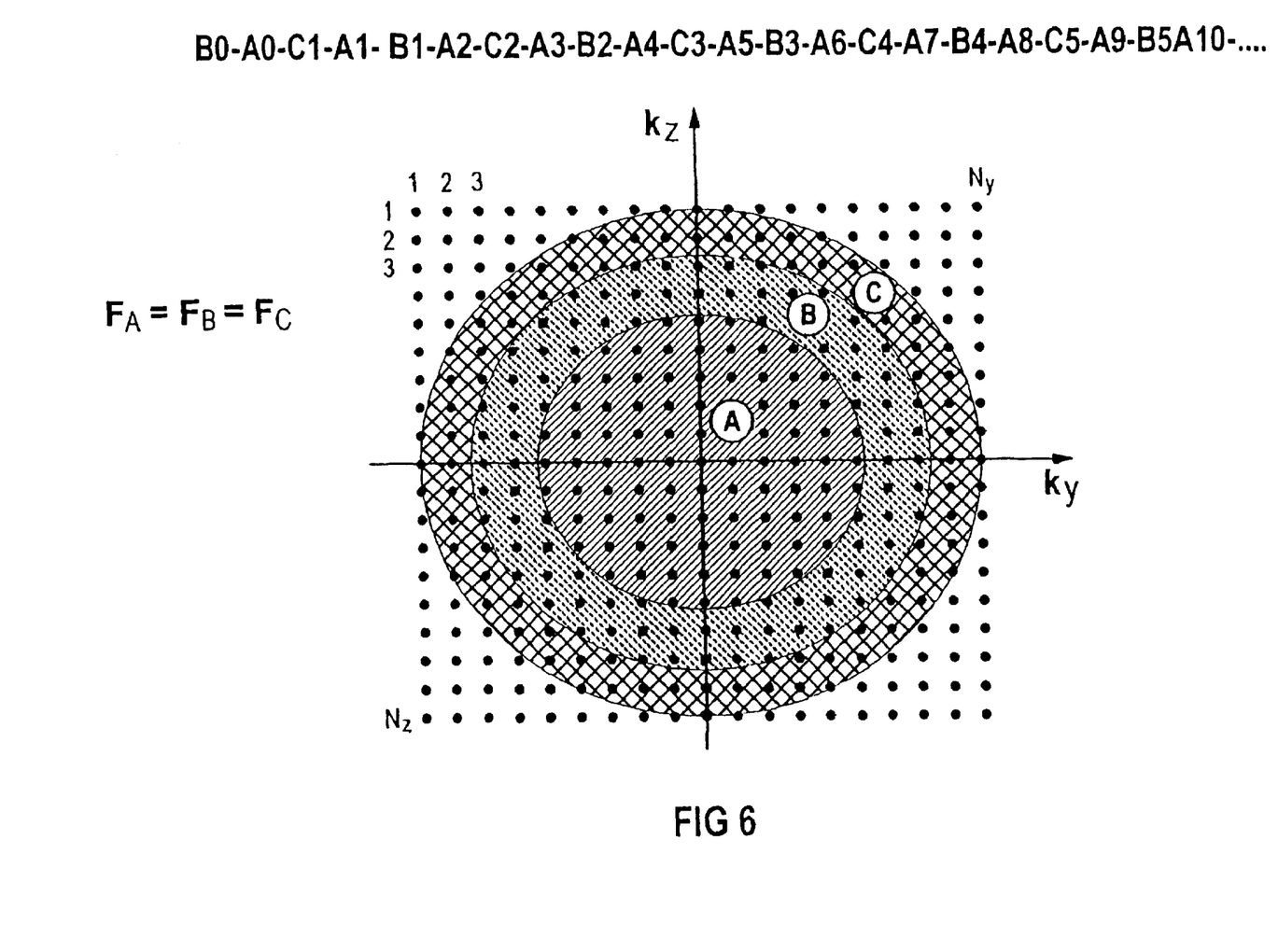
FIG. 6 shows the annular segmentation of the k-space matrix with specification of the measuring sequence in accordance with the invention.

Although this type of segmenting leads to a considerable reduction of the measurements to be implemented, it has the following disadvantage. Although the spatial/time resolution in the y-direction and the x-direction is not diminished, the spatial/time resolution in the z-direction is indeed diminished. When the vessel being observed lies in the y-direction or the x-direction, this means practically no disadvantage. When, however, the vessel under observation lies at an angle to the x-y plane or even in the z-direction, then the spatial/time resolution is reduced precisely in the direction in which it is needed most. The quality of this method is therefore highly dependent on the direction in which the vessels under observation lie in relationship to the direction of the segmenting. This directional dependency is eliminated when, in conformity with the invention, the three-dimensional k-space is divided into annular segments A, B and C. FIG. 6 shows a corresponding example, again in z-y section. The respective areas of the segments A, B and C are all equal. The sequence of the measurements allocated to the individual segments, this sequence being likewise indicated in FIG. 6, is identical to that shown in FIG. 5, i.e. the data for the central segment A here are also measured twice as often as the data for the outer segments B and C.

The symmetry of the k-space division is adapted better to the subject to be imaged given annular segmentation. When, for example, the subject is a vessel having its longitudinal direction along the readout gradient, the crossection of the vessel lies in the plane of the two phase coding gradients Gy and Gz. The vessel crossection is described by a circular area in a first approximation and, thus, the annular k-space segmenting is adapted best to the problem. An optimum relationship of time and spatial resolution results therefrom. The number of required measurements is reduced compared to the known technique since the rows of the matrix lying outside the annular segments A, B and C are not measured.

Figure 7:
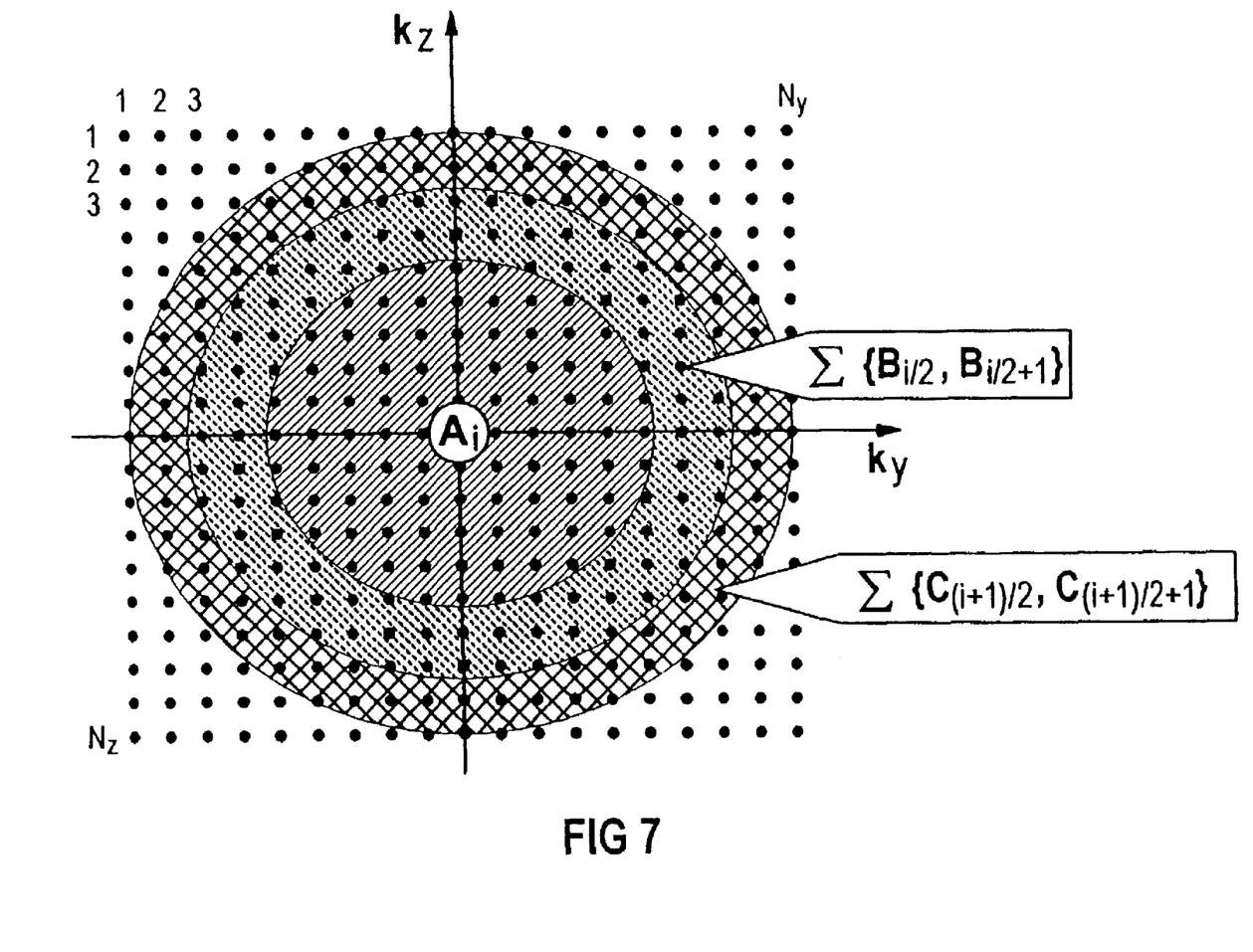
FIG. 7 shows the same segmentation with interpolation entered therein in accordance with the invention.

FIG. 7 indicates that the data in the segments B and C are acquired by linear interpolation from the measurements that lie closest in time to the respective measurement A.

Figure 8:
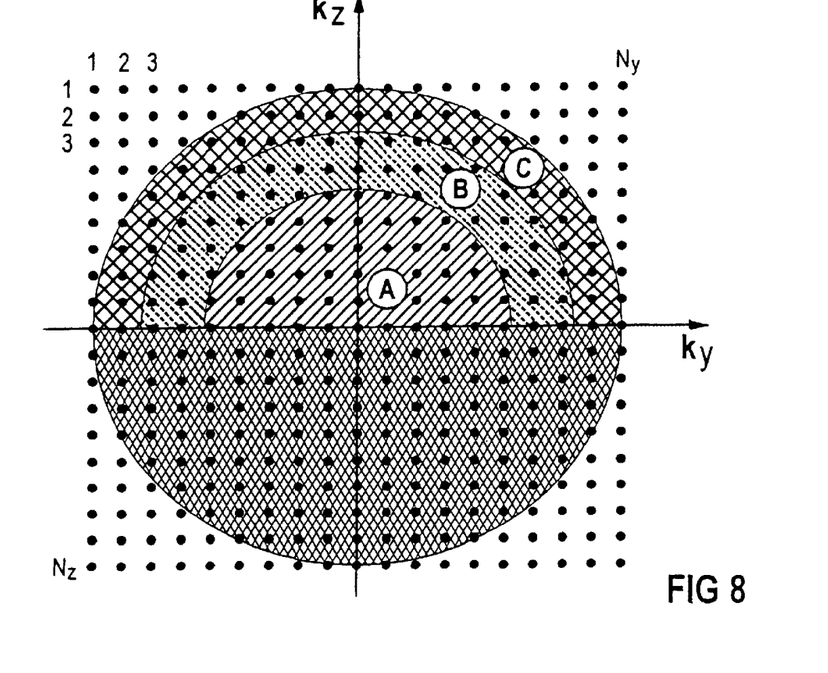
FIG. 8 illustrates a method wherein only the upper half of the k-space is sampled in accordance with the invention.
Figure 9:
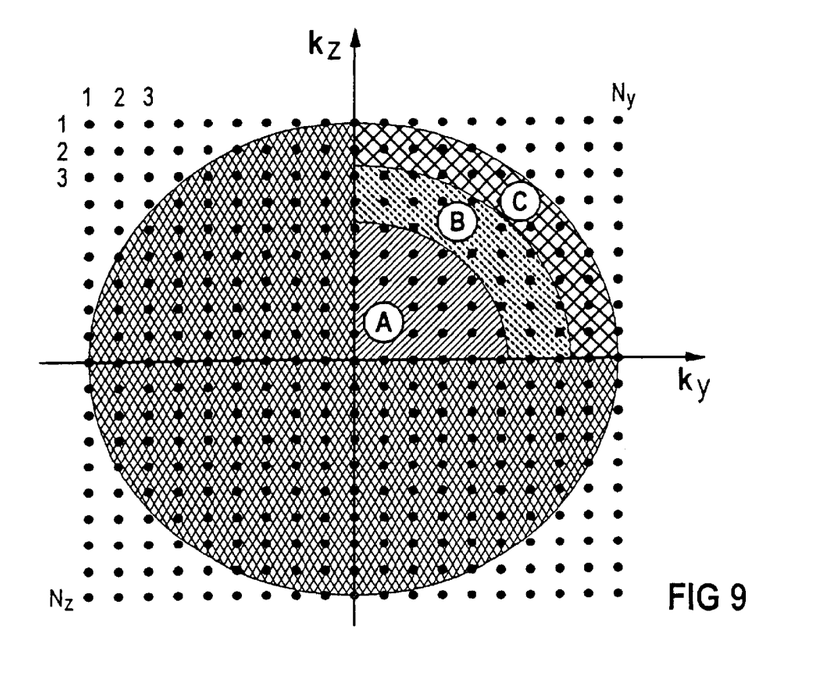
FIG. 9 illustrates a method wherein only one-fourth of the k-space is sampled in accordance with the invention.

The number of measurements needed for the acquisition of a complete image dataset can be reduced further by exploiting the fact that the raw data matrices are conjugate-symmetrical in k-space. As shown in FIG. 8, the measurement can be limited to only one half of k-space or—as shown in FIG. 9—to even only one-fourth of k-space. These techniques are known in the art as half-Fourier and quarter-Fourier acquisition, respectively.

Given the half-Fourier technique, for example, 60 measuring points in the z-direction and 120 measuring points in the y-direction can be selected given an isotropic resolution of 1×1×1 mm². The number n of nuclear magnetic resonance signals to be measured then amounts to: n=π/4×60× 120~5640.

Given three ring (annulus) segments equal in area, each segment then contains roughly 1880 lines. The time resolution, i.e. the time spacing of two middle segments, then amounts to 3760×TR, wherein TR is the repetition time of the pulse sequence. Given a repetition time TR of 3 milliseconds, this yields a measuring time of 11.3 seconds for a 3D image dataset. For tracking the time sequence, a number of such measurements are combined, so that a spatial and time resolution adequate for the dynamic tracking of the contrast agent enrichment is obtained. It is to be emphasized that the number of segments described herein and the equality of the areas of the segments are only as an example. Dependent on the application, the number of segments and the relationship of the areas relative to one another can also be differently selected.

Although modifications and changes may be suggested by those skilled in the art, it is the intention of the inventor to embody within the patent warranted hereon all changes and modifications as reasonably and properly come within the scope of my contribution to the art.

I claim:

1. A method for acquiring time-resolved and spatially resolved three-dimensional datasets by magnetic resonance, comprising the steps of:
   (a) exciting nuclear spins in an examination subject;
   (b) phase coding said nuclear spins in a first direction with a first phase coding gradient and in a second direction with a second phase coding gradient;
   (c) reading out said nuclear spins from said subject under a readout gradient in a third direction;
   (d) repeating steps (a) through (c) with respectively different combinations of phase coding in said first and second directions, to acquire a plurality of three-dimensional datasets occupying three-dimensional k space in respective segments, said segments comprising a central, cylindrical segment and a plurality of annular cylindrical segments successively surrounding said central cylindrical segment, each of said segments having a longitudinal axis in said third direction; and
   (e) repeating steps (a) through (d) for acquiring a plurality of three-dimensional datasets respectively allocated to a plurality of different time spans, with the different combinations of said phase coding gradients in step (d) having a chronological sequence so that data occupying said central k space segment are acquired more often than data occupying said annular segments.

2. A method as claimed in claim 1 comprising occupying one of said annular segments with interpolation values formed from data chronologically surrounding the time span of said central segment.

3. A method as claimed in claim 1 wherein all of said segments have a same cross-sectional area.

4. A method as claimed in claim 1 comprising obtaining data for occupying substantially only half of k space.

5. A method as claimed in claim 1 comprising obtaining data for occupying substantially only one-quarter of k space.

6. A method as claimed in claim 1 comprising the additional step of injecting a contrast agent into said subject and conducting step (a) after injecting said contrast agent.

7. A method as claimed in claim 6 comprising identifying a dynamic spread of said contrast agent by the repetitions in step (c) and (d).

8. A magnetic resonance tomography apparatus comprising:
   (a) a basic field magnet adapted to receive an examination subject in an examination field;
   (b) a gradient system for producing a readout gradient and two phase coding gradients, in respectively different directions, in said examination field;
   (c) a radio frequency system for exciting nuclear magnetic resonance signal in said subject and for receiving said nuclear magnetic resonance signals from said subject;
   (d) a signal processor for sampling and storing the nuclear magnetic resonance signals received from said subject and for reconstructing an image therefrom represented by three-dimensional k space; and
   (e) a control unit connected to said gradient system for operating said gradient system to readout said nuclear magnetic resonance signals in k space segments, said segments including a cylindrical, central segment and a plurality of cylindrical annular segments successively surrounding said central segment and having respective longitudinal axes in a direction of said readout gradient, and for causing nuclear magnetic resonance signals in said central segment of k space to be acquired more often than nuclear magnetic resonance signals in said annular segments.

* * * * *